(12) United States Patent
Janes et al.

(10) Patent No.: US 10,840,090 B2
(45) Date of Patent: Nov. 17, 2020

(54) METHOD FOR FORMING A CROSS-LINKED LAYER

(71) Applicants: IMEC VZW, Leuven (BE); Katholieke Universiteit Leuven, KU LEUVEN R&D, Leuven (BE)

(72) Inventors: Dustin Janes, Leuven (BE); Jan Doise, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 52 days.

(21) Appl. No.: 16/278,405

(22) Filed: Feb. 18, 2019

(65) Prior Publication Data

US 2019/0259607 A1 Aug. 22, 2019

(30) Foreign Application Priority Data

Feb. 16, 2018 (EP) .................................... 18157203

(51) Int. Cl.
*H01L 21/02* (2006.01)
*H01L 21/3105* (2006.01)
*G03F 7/00* (2006.01)

(52) U.S. Cl.
CPC ...... *H01L 21/02348* (2013.01); *G03F 7/0002* (2013.01); *H01L 21/02118* (2013.01); *H01L 21/02282* (2013.01); *H01L 21/31058* (2013.01)

(58) Field of Classification Search
CPC combination set(s) only.
See application file for complete search history.

(56) References Cited

U.S. PATENT DOCUMENTS

| | | | |
|---|---|---|---|
| 7,521,090 B1 | 4/2009 | Cheng et al. | |
| 9,478,435 B2 | 10/2016 | Mohanty | |
| 9,618,849 B2 | 4/2017 | Muramatsu et al. | |
| 2010/0102029 A1 | 4/2010 | Schmid et al. | |
| 2010/0124629 A1 | 5/2010 | Gopalan et al. | |
| 2012/0207940 A1* | 8/2012 | Muramatsu ......... | C09D 153/00 427/510 |
| 2012/0244474 A1 | 9/2012 | Asakawa et al. | |
| 2013/0313223 A1 | 11/2013 | Fujikawa et al. | |
| 2015/0064917 A1 | 3/2015 | Somervell et al. | |
| 2017/0114246 A1 | 4/2017 | Arellano et al. | |

OTHER PUBLICATIONS

European Search Report, European Patent Application No. 18157203.3, dated Jul. 30, 2018, 9 pages.

(Continued)

*Primary Examiner* — Moin M Rahman
(74) *Attorney, Agent, or Firm* — McDonnell Boehnen Hulbert & Berghoff LLP

(57) ABSTRACT

A method for forming on a substrate a cross-linked layer for directing the self-assembly of a self-assembling material is provided. The method including: (a) providing a structure having the substrate; (b) providing on the substrate a layer of a photo- and thermally cross-linkable substance which, when crosslinked, is suitable for directing the self-assembly of a self-assembling material; (d) photocrosslinking the cross-linkable substance partially; and (d) cross-linking the substance further thermally, thereby forming the cross-linked layer.

19 Claims, 4 Drawing Sheets

(56) References Cited

OTHER PUBLICATIONS

Liu, Chi-Chun et al., "Fabrication of Lithographically Defined Chemically Patterned Polymer Brushes and Mats", ACS Publications, Macromolecules, vol. 44, 2011, pp. 1876-1885.

Katzenstein, Joshua M. et al., "A Photochemical Approach to Directing Flow and Stabilizing Topography in Polymer Films", ACS Publications, Macromolecules, vol. 47, 2014, pp. 6804-6812.

Koh, Haeng-Deog et al., "Directed Self-Assembly on Photo-Crosslinked Polystyrene Sub-Layers: Nanopattern Uniformity and Orientation", Materials, vol. 9, No. 648, 2016, pp. 1-11.

Oda, Hirokazu et al., "Dewetting Photocontrol of Poly(styrene) Thin Films by a Photocrosslinkable Monolayer in Thermal Nanoimprint Lithography", Journal of Photopolymer Science and Technology, vol. 22, No. 2, 2009, pp. 195-199.

Akhrass, Samer Al et al., "Influence of Progressive Cross-Linking on Dewetting of Polystyrene Thin Films", Langmuir, vol. 24, 2008, pp. 1884-1890.

* cited by examiner

Top (prior art)

Bottom (embodiment)

METHOD FOR FORMING A CROSS-LINKED LAYER

CROSS-REFERENCE

This application claims priority from European patent application no. 18157203.3, filed Feb. 16, 2018, which is incorporated by reference in this entirety.

TECHNICAL FIELD OF THE DISCLOSURE

The present disclosure relates to the field of semiconductor device manufacturing. More in particular, the present disclosure relates to the field of directed self-assembly (DSA).

BACKGROUND OF THE DISCLOSURE

In many implementations, DSA is a pitch-multiplying technique that has the potential to supplement optical lithography in the fabrication of fine grating patterns in future microelectronic devices. The first coating of a DSA-related material onto a substrate is a thermally cross-linkable polymer mat such as crosslinkable-Polystyrene (X-PS). Lithography and etching can be performed subsequently to shape the crosslinked mat into a guiding pattern capable of directing the self-assembly of a microphase-separated block copolymer film.

An example of a DSA technique is disclosed in Chi-Chun Liu et al., Macromolecules 2011, 44, 1876-1885 where a cross-linkable polystyrene is deposited by spin-coating on a flat silicon substrate, thermally cross-linked, then patterned by photolithography, covered by a brush-forming polymer, and covered with a self-assembling block copolymer. Such a procedure can work fine as long as the silicon substrate is flat.

However, the lithography in many modern microelectronic devices is generally performed atop substrates that have already been patterned with circuitry, insulators, etch-stops, etc. and may not be topographically flat. Therefore, a ubiquitous motif in high-volume manufacturing (HVM) production flows is the use of a bilayer coating directly beneath the thermally cross-linkable polymer.

The lower layer of the bilayer coating is typically an organic material, such as spin-on-carbon (SOC), which serves to planarize any topography on the substrate. The upper layer of the bilayer coating is typically an inorganic material, such as spin-on-glass (SOG), which provides etch contrast and aids in pattern transfer of the lithographically defined features above it to the underlying substrate. This upper layer is commonly referred to as a hardmask material.

Unfortunately, many of the thermally crosslinkable polymer mats used in DSA, such as X-PS, dewet during thermal crosslinking when they are placed upon popular hardmask materials such as SOG. X-PS can be spin-coated atop SOG into a smooth film, but it is intrinsically unstable and the film quickly breaks into microscopic droplets when the XPS is heated above its glass transition temperature (see FIG. 1, top). The DSA community does not currently possess a general strategy to obtain crosslinked polymer mats atop any substrate. In particular, no general solution exists to obtain X-PS on SOG. Therefore, DSA flows that use cross-linked polymer mats in general, and X-PS in particular, as guiding material may be viewed as fundamentally incompatible with many hardmask materials. Unfortunately, this is a potential showstopper that inhibits industry implementation of DSA. Accordingly, there is a need in the art for a general strategy for crosslinking guiding materials such as (but not limited to) X-PS atop a variety of substrates (including, but not limited to, SOG).

SUMMARY OF THE DISCLOSURE

It is an object of the present disclosure to provide good methods for forming on a substrate, without dewetting, a cross-linked layer for directing the self-assembly of a self-assembling material.

In some embodiments of the present disclosure, a cross-linked layer for directing the self-assembly of a self-assembling material can be formed on many substrates without dewetting, including on substrates known to be particularly prone to induce dewetting such as SOG substrates.

In some embodiments of the present disclosure, a cross-linked layer for directing the self-assembly of a self-assembling material can be formed on many substrates without significantly changing the surface properties of the cross-linked layer when compared with the same layer which has been entirely thermally crosslinked. This can be useful because cross-linked layers for directing the self-assembly of a self-assembling material can be typically used because of their chemical resemblance to a part of the self-assembling material, thereby permitting their self-assembly. Generally, it may not be desirable to modify the surface properties of the cross-linked layer. By partially photocrosslinking the cross-linkable substance, some embodiments of the present disclosure only expose the substance to moderate irradiation.

In some embodiments of the present disclosure, the method can be very rapid since the additional step, compared to conventional thermal crosslinking, is rapid since only a partial photocrosslinking may be performed.

In some embodiments of the present disclosure both crosslinking steps, the photocrosslinking and the thermal crosslinking, can be performed with the same tool and is compatible with standard semiconductor processing.

The present disclosure relates to a method for forming on a substrate (1) a cross-linked layer (2) for directing the self-assembly of a self-assembling material, the method comprising:

a) providing a structure having the substrate (1), b) providing on the substrate (1) a layer of a photo- and thermally cross-linkable substance (3) which, when cross-linked, is suitable for directing the self-assembly of a self-assembling material, c) photocrosslinking the cross-linkable substance (3) partially, d) cross-linking the substance (3) further thermally, thereby forming the cross-linked layer (2).

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of methods in this field, the present concepts are believed to represent substantial new and novel improvements, including departures from prior practices, resulting in the provision of more reliable methods of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
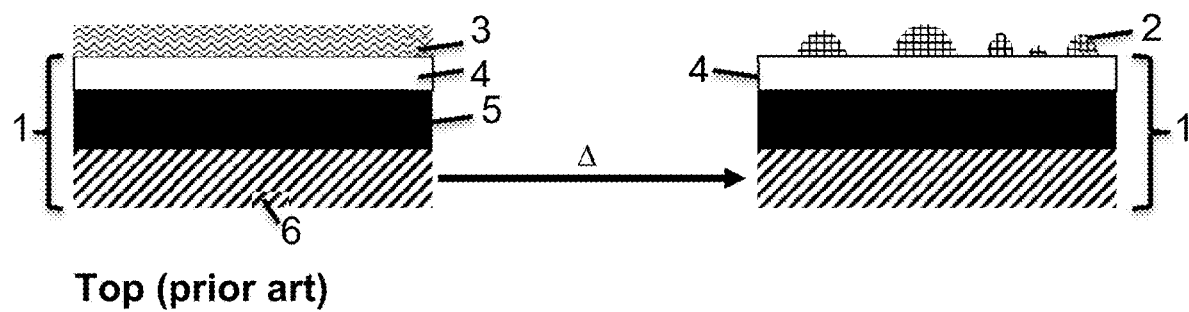
FIG. 1 is a schematic representation of a vertical cross-section view of a conventional method (top) and according to a representative embodiment of the present disclosure (bottom).
Figure 1:
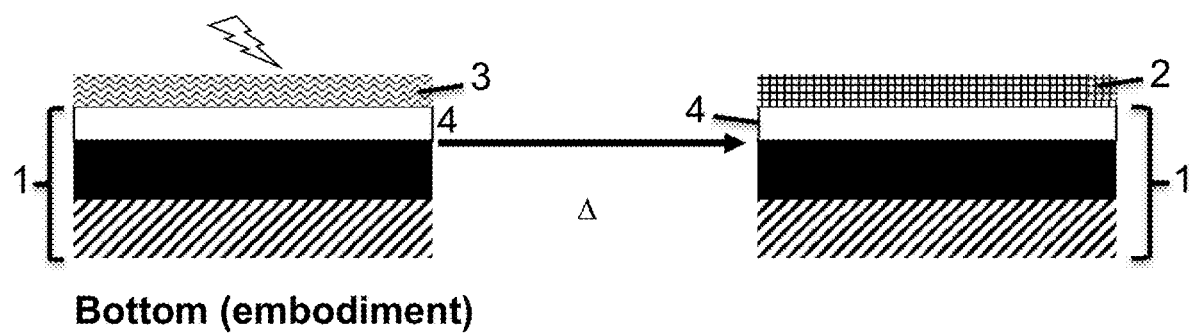

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, may be used for distinguishing between similar elements and not necessarily for describing a sequence, either temporally, spatially, in ranking or in any other manner. It is to be understood that the terms so used may be interchangeable under appropriate circumstances and that the embodiments of the disclosure described herein may be capable of operation in other sequences than described or illustrated herein.

Moreover, the terms top, bottom, over, under and the like in the description and the claims may be used for descriptive purposes and not necessarily for describing relative positions. It is to be understood that the terms so used may be interchangeable under appropriate circumstances and that the embodiments of the disclosure described herein may be capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification may not necessarily all referring to the same embodiment, but may. Furthermore, the particular features, structures or characteristics may be combined in any suitable manner, as would be apparent to one of ordinary skill in the art from this disclosure, in one or more embodiments.

As used herein and unless provided otherwise, by the term "cross-linkable", it is meant that the substance comprises a polymer in which adjacent polymer chains can be joined by creating covalent bonds.

Similarly, it should be appreciated that in the description of exemplary embodiments of the disclosure, various features of the disclosure may sometimes be grouped together in a single embodiment, figure, or description thereof for the purpose of streamlining the disclosure and aiding in the understanding of one or more of the various aspects of the disclosure. This method of disclosure, however, is not to be interpreted as reflecting an intention that the embodiments of the disclosure require more features than are expressly recited in each claim. Rather, as the following claims reflect, aspects of the disclosure lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments described herein as a method or combination of elements of a method can be implemented by a processor of a computer system or by other means of carrying out the function. Thus, a processor with the necessary instructions for carrying out such a method or element of a method may form a means for carrying out the method or element of a method. Furthermore, an element described herein of an apparatus embodiment may be an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The disclosure will now be described by a detailed description of several embodiments of the disclosure. It is clear that other embodiments of the disclosure can be configured according to the knowledge of persons skilled in the art without departing from the true spirit or technical teaching of the disclosure, the disclosure being limited only by the terms of the appended claims.

Referring to FIG. 1, the present disclosure relates to a method for forming on a substrate (1) a cross-linked layer (2) for directing the self-assembly of a self-assembling material, the method comprising:

a) providing a structure having the substrate (1), b) providing on the substrate (1) a layer of a photo- and thermally cross-linkable substance (3) which, when cross-linked, is suitable for directing the self-assembly of a self-assembling material, c) photocrosslinking the cross-linkable substance (3) partially, d) cross-linking the substance (3) further thermally, thereby forming the cross-linked layer (2).

The provided structure comprising the substrate can be any structure but will typically be a semiconductor device under construction.

As used herein, and unless provided otherwise, the "substrate" may be at least a part of the structure, said part comprising the surface on which the cross-linked layer will be formed. It can, for instance, be a slab of a solid such as a semiconductor wafer or it can be such a slab of a solid (6) on which one or more layers (4, 5) may be present. For instance, it can be a silicon wafer (6) on which a SOC layer (5) is present, on which a SOG layer (4) is present.

The present disclosure is applicable to any substrate. Indeed, the present disclosure has been shown to work as well on a Si wafer, which may be typically unproblematic, and on a SOG layer, which may be one of the most difficult substrates on which to crosslink a layer (2) for directing the self-assembly of a self-assembling material.

The substrate is typically not made of the same material as the cross-linked layer, but this is not necessarily so.

In embodiments, the substrate (1) may comprise a hardmask (4) as a top layer. Many hard masks may be difficult substrates for forming a cross-linked layer (2) for directing the self-assembly of a self-assembling material. The method of the present disclosure can be applied to any substrates but for substrates such as Si wafers, thermal cross-linking is typically available without dewetting. This may not be true for hardmasks. Most hardmasks commonly used in lithographic processes for the fabrication of semiconductor devices can be very difficult to coat with a layer for directing the self-assembly of a self-assembling material and can typically lead to dewetting if thermal cross-linking is attempted. A notable exception may be the hardmask silicon nitride. For example, X-PS can be thermally crosslinked atop a vapor-deposited silicon nitride hardmask without dewetting. The present disclosure permits cross-linking on any hardmask without dewetting. Suitable hardmasks may be selected from the group consisting of SOG, $SiO_2$ (e.g. provided by plasma-enhanced atomic layer deposition), SiN, or amorphous carbon hardmasks (such as APF).

In embodiments, the hardmask may be other than silicon nitride. Although the present disclosure works on silicon nitride, pure thermal cross-linking may be an alternative for X-PS on that substrate.

The hardmask can have any thickness. For instance, it may have a thickness ranging from 5 to 20 nm.

In embodiments, the hardmask (4) may comprise a spin-on-glass top layer. The present disclosure may be particularly useful for forming, on a SOG top layer, a cross-linked layer (2) for directing the self-assembly of a self-assembling material. SOG may be a notoriously difficult substrate for forming a cross-linked layer (2) due to dewetting in virtually all alternative known procedures to the present disclosure. The term "spin-on-glass" or "SOG" may be hereinafter understood to mean a layer of a spin-coated liquid of an organic precursor of silica which may be subsequently heated and transformed into a silica coat. Examples of suitable precursors can be alkoxysilanes, alkylalkoxysilanes, silsesquioxanes, hydrogensiloxanes, hydroorganosiloxanes, hydrogensilsesquioxanes, or acetoxysilanes, to name but a few, as well as derivatives and combinations thereof.

A typical substrate may comprise a semiconductor wafer, such as a Si wafer, on which typically circuitry has been patterned; a spin-on carbon (SOC) layer thereon, to offer a plane top surface; and a SOG layer thereon, to serve as hard mask. In such a typical substrate, the SOC layer may, for instance, have a thickness of from 50 to 100 nm and the SOG layer may have a thickness of from 5 to 20 nm.

In theory, the present disclosure can be particularly useful when the photo- and thermally cross-linkable substance (3) in its molten state has a negative spreading parameter S as determined by the following equation: $S=\gamma_{SG}-(\gamma_{SL}+\gamma_{LG})$ wherein $\gamma_{SG}$, $\gamma_{SL}$, and $\gamma_{LG}$ are the solid-gas, solid-liquid, and liquid-gas surface energies respectively. To predict a priori if dewetting would be likely to occur without the present disclosure, one needs knowledge of $\gamma_{LG}$ of the molten cross-linkable substance, of $\gamma_{SG}$ of the top surface of the substrate, and of the interfacial tension between the molten cross-linkable substance and the top surface of the substrate ($\gamma_{SL}$). $\gamma_{SG}$ and $\gamma_{LG}$ can be measured from liquid contact angle experiments. $\gamma_{SL}$ is typically measured from contact angle of dewetted films. In practice then, determining the top surface/cross-linkable substance combinations for which the present disclosure is particularly useful may therefore be determined experimentally by observing dewetting when the disclosure is not used and the cross-linkable substance may be entirely thermally crosslinked.

In embodiments, the photo- and thermally cross-linkable substance (3) may comprise a polymer comprising one or more repeat units of the following formula

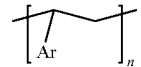

wherein Ar is an aromatic group, substituted or not.

Examples of Ar groups may be phenyl groups (e.g. originating from the polymerization of styrene), pyridine groups (e.g. originating from the polymerization of 2-vinyl pyridine), anthracene groups (e.g. originating from the polymerization of 9-vinylanthracene), or naphthalene groups (e.g. originating from 2-vinylnaphthalene).

When substituted, the Ar group may have from 1 to 5 substituents. Examples of substituents for the Ar group may be esters of the type alkyl (generally methyl; the alkyl may be optionally substituted with one or two aryl groups such as phenyl groups; the alkyl may be optionally substituted with an amine group such as an amino group, N,N-dimethyl amino group, trimethylammonium chloride group, or an N-(Methylaminoethyl)amino group; the alkyl may be optionally substituted with a halogen group such as a chlorine group), —O—CO-alkyl (with alkyl usually being a $C_1$-$C_4$ alkyl), or alkyl ether (usually methyl or ethyl; with the alkyl optionally substituted with an aryl such as a phenyl), halogen (usually Br, Cl or F), diphenylphosphino, nitro, trihalomethyl (usually with the halogen being fluoro), cyclobutene (substituting two successive positions on the aryl, such as in 4-vinylbenzocyclobutene), carboxylic acid, hydroxyl, or aryl (usually phenyl).

A polymer comprising such repeat units can be used as cross-linked layer (2) for directing the self-assembly of a self-assembling material. This may be in part due to the fact that many self-assembling materials can be block copolymers comprising a block comprising similar repeat units. The close chemical correspondence between the crosslinked layer and one of the blocks of the block-copolymer may be one of the strategies used to direct block copolymer self-assembly.

Examples of monomers that can be used to introduce the above repeat units may be 4-acetoxystyrene; 4-benzhydrylstyrene, 4-benzyloxy-3-methoxystyrene; 2-bromostyrene; 3-bromostyrene; 4-bromostyrene; 4-tert-butoxystyrene; 4-tert-butylstyrene; 2-chlorostyrene 3-chlorostyrene; 4-chlorostyrene; 2,6-dichlorostyrene; 2,6-difluorostyrene; 3,4-dimethoxystyrene; 2,4-dimethylstyrene; 2,5-dimethylstyrene; N,N-dimethylvinylbenzylamine, 4-(diphenylphosphino)styrene; 4-ethoxystyrene; 2-fluorostyrene; 3-fluorostyrene; 4-fluorostyrene; 4-[N-(methylaminoethyl) aminomethyl]styrene; 3-methylstyrene; 4-methylstyrene; 3-nitrostyrene; pentafluorophenyl 4-vinylbenzoate; 2,3,4,5, 6-pentafluorostyrene 2-(trifluoromethyl)styrene; 3-(trifluoromethyl)styrene; 4-(trifluoromethyl)styrene; 2,4,6-trimethylstyrene; 3-vinylaniline; 4-vinylaniline; 4-vinylanisole; 9-vinylanthracene; 4-vinylbenzocyclobutene; 3-vinylbenzoic acid; 4-vinylbenzoic acid; 4-vinylbenzyl chloride; (vinylbenzyl)trimethylammonium chloride; 4-vinylbiphenyl; or 2-vinylnaphthalene.

Other suitable monomers not falling under the above formula can be α-bromostyrene; 1,3-diisopropenylbenzene, 2,4-diphenyl-4-methyl-1-pentene; 2-isopropenylaniline; 3-isopropenyl-α,α-dimethylbenzyl isocyanate; or α-methylstyrene.

In embodiments, the polymer comprises polymerized styrene repeat units, wherein the phenyl ring is substituted or not. Such polymers are generally amongst the most often used cross-linked layer for directing the self-assembly of a self-assembling material because the self-assembling material can be most often a block-copolymer having a polystyrene block. A typical example of such self-assembling material can be a block copolymer comprising a polystyrene (PS) block and a poly(methyl methacrylate) (PMMA) block (PS-b-PMMA). A very typical example of an embodiment of the present disclosure can involve a substrate having a SOG top surface, a photo- and thermally crosslinkable polystyrene provided in step (b) and a PS-b-PMMA provided in step (e).

In embodiments, the polymer may comprise a repeat unit imparting it with thermal cross-linkability. For instance, the repeat unit may be obtained from the copolymerization of a monomer selected from the group consisting of 4-vinyl benzocylobutene, glycidyl (meth)acrylate, and 4-vinyl benzyl azide. Of course, many other monomers imparting thermal cross-linkability may be used.

Two examples of polymers usable in the present disclosure are random copolymers obtained from the copolymerization of styrene and 4-vinyl benzocylobutene; or 2-vinyl pyridine and 4-vinyl benzocylobutene. Both polymers have been observed to dewet when thermally crosslinked on SOG. For instance, the random copolymers obtained from the copolymerization of styrene and 4-vinyl benzocylobutene may comprise 90-95 mol % of repeat units obtained from styrene and 5-10 mol % of repeat units obtained from 4-vinyl benzocyclobutene.

In some embodiments, the cross-linkable substance does not comprise pendant groups that would not survive the photocrosslinking step.

The substance may be provided on the substrate by any coating technique. In some embodiments, the coating technique is spin coating.

The substance may be provided on the substrate as a layer. In embodiments, the layer of the photo- and thermally cross-linkable substance as deposited in step (b) may have a thickness lower than 100 nm. A typical thickness for suitable for the present disclosure may range from 5 to 20 nm.

Between step (b) and step (c), the layer of cross-linkable substance may be heated up (soft bake) in order to remove solvents. This can, for instance, be performed at a temperature ranging from 80 to 120° C. for a time of at least 30 s, for instance from 30 s to 2 minutes. Although this soft bake step is not necessary, it may be useful when lower UV doses are used in the photocrosslinking step. For instance, a soft bake step may be useful for a UV dose below 10 mJ/cm$^2$.

In embodiments, step (c) of photocrosslinking the cross-linkable substance partially may be performed with an energy ranging from 1 mJ/cm$^2$ to 1000 mJ/cm$^2$, generally ranging from 2 mJ/cm$^2$ to 300 mJ/cm$^2$, usually ranging from 10 mJ/cm$^2$ to 100 mJ/cm$^2$. In some embodiments, the energy level may remain below 400 mJ/cm$^2$ because surface energy modification of the cross-linked substance has been observed at that dose.

In embodiments, the wavelength chosen to perform the photo crosslinking may be comprised within the absorption spectra of the substance. For instance, polystyrene absorbs essentially below 300 nm so that a UV radiation with a wavelength below 300 nm may be used.

In embodiments, step (c) may be performed under inert atmosphere. For instance, an Ar, $N_2$ atmosphere can be used, or step (c) can be performed under vacuum. Step (c) may also be performed in air but the likelihood of photo-oxidative degradation of the substance may be greater in such conditions.

In embodiments, step (c) may last for less than a minute. This may be typically sufficient for providing the irradiation dose necessary to partially cross-link the substance. More typically, step (c) may last for less than 30 s, or for less than 5 s. For instance, step (c) may last from 0.5 to 5 s.

Before to proceed to the thermal crosslinking, it may be possible to coat the partially photo-crosslinked layer with another layer of cross-linkable substance. This can permit an increase in the thickness of the final crosslinked layer.

The final thermal crosslinking step may be necessary to assure that the cross-linked film does not wash off during subsequent directed self-assembly steps. Performing this step thermally may preserve the surface properties of the cross-linked film. Entirely cross-linking the film with UVs could change the surface properties of the cross-linked film drastically.

The thermal crosslinking may be typically performed at a temperature exceeding the glass transition temperature of the substance. Most typically, the temperature may be chosen in function of the type of repeat unit imparting the polymer with thermal cross-linkability. In the case of a crosslinkable polystyrene (for instance when the polystyrene comprises repeat units obtained from the copolymerization of 4-vinyl benzocylobutene), the temperature may, for instance, be selected between 230 and 350° C., usually between 250° C. and 350° C.

In embodiments, step (d) may lead to a complete cross-linking of the substance (3), e.g. a gel fraction of unity.

In embodiments, the duration of the thermal crosslinking step may, for instance, be from 1 to 10 minutes.

The thermal crosslinking step can be performed under inert atmosphere (cf step (b)) but it can also be performed in air in some embodiments.

In embodiments, the thermal crosslinking step (d) may be performed directly after step (c). For instance, it may be performed before the deposition of a self-assembling material thereon.

The cross-linked layer obtained after step (d) may typically be insoluble. It may be suitable for directing the self-assembly of a self-assembling material. In embodiments, the cross-linked layer may be patterned before use to direct self-assembly.

In embodiments, the method may further comprise after step (d), a step (e) of providing on the cross-linked layer (2), a further layer of the photo- and thermally cross-linkable substance (3), and entirely cross-linking it thermally. This second layer has not been photocrosslinked and its surface has therefore not been altered at all by irradiation. As this second layer being formed on a first layer of the same nature, its tendency to dewet may be low and it is therefore not necessary to use a photocrosslinking step before the thermal crosslinking step. However, it is possible to photocrosslink the first layer with a dose of at least 300 mJ to further reduce the tendency of the second layer to dewet on the first layer.

In embodiments, the method may further comprise a step (f) after step (d) and after step (e) if present, of providing a self-assembling material on the cross-linked substance (2).

Self-assembling materials usable in the context of the present disclosure can be typically chosen as a function of the nature of the cross-linked layer. In some embodiments, the self-assembling material can be a block copolymer having a block having more chemical affinity for the cross-linked layer and a block having less affinity for the cross-linked layer. For this purpose, one of the blocks may comprise repeat units also present in the cross-linked layer. For instance, one of the blocks may comprise more than 50 at %, generally more than 90 at % repeat units that are present in the cross-linked layer in a proportion of more than 50 at %, usually more than 90 at % respectively.

After deposition of the self-assembling material on the cross-linked layer (patterned or not), the self-assembly can be generally triggered by annealing the self-assembling material. This typically can lead to a phase separation in the self-assembling material. This phase separation can in some embodiments take the form of lamellar structures formed of alternating lamella, alternating in chemical composition between the composition of a first block and the composition of a second block of the block copolymer. A next step can typically be the selective removal of one of the blocks, leaving trenches in which walls can be made of the remaining block. These trenches can then be used to etch trenches in a top portion of the substrate (for instance in a hardmask, later transferred to a semiconductor wafer by lithography).

EXAMPLES

The tool used for the examples below was a Lithius Pro-Z track (Tokyo Electron)

Example 1

Forming a Single Layer of Cross-Linked Polystyrene on a Silicon Wafer

For the purpose of avoiding dewetting during the cross-link of a single layer of X-PS having a thickness of 7.5-8.0 nm, the following steps were performed: cross-linkable polystyrene AZEMBLY™ NLD-128 was spin-coated at 1500 RPM onto a silicon wafer. The polymer film was soft-baked at 100° C. for one minute to remove solvent, and then blanket-irradiated with $\lambda$=173 nm UV light in an $N_2$ purged chamber. The dose was 90 mJ/cm$^2$, which takes <5 s to apply and is near the minimum possible dose that can be programmed into the tool. This led to a partial crosslinking.

The degree of cross-linking was evaluated by repeating these first steps on a separate Si substrate followed by measuring the film thickness, rinsing the film by dispensing propylene glycol monomethyl ether acetate (PGMEA) on the film rotating at 1500 rpm of 45 s, then measuring the film thickness again and comparing the film thickness before and after rinsing. The ratio obtained, expressed in %, gives an indication of the degree of cross-linking and is called herein the "gel fraction remaining". The existence of a gel fraction remaining can be a good indication that no dewetting will occur. After the blanket irradiation, the partially cross-linked film was hard baked at 315° C. for 5 min in an $N_2$ atmosphere and rendered fully insoluble. No dewetting was observed.

Example 2

Forming a Single Layer of Cross-Linked Polystyrene on a Silicon Wafer without Soft Bake For the purpose of avoiding dewetting during the cross-link of a single layer of X-PS having a thickness of 7.5-8.0 nm, the following steps are performed: cross-linkable polystyrene AZEMBLY™ NLD-128 is spin-coated at 1500 RPM onto a silicon wafer. The polymer film is not soft-baked but is directly blanket-irradiated with $\lambda$=173 nm UV light in an $N_2$ purged chamber. The dose is 90 mJ/cm$^2$, which takes <5 s to apply and is near the minimum possible dose that can be programmed into the tool. This can lead to a partial cross-linking. Afterwards, the film is hard baked at 315° C. for 5 min in an $N_2$ atmosphere and rendered fully insoluble.

Example 3

Forming a Single Layer of Cross-Linked Polystyrene on a Silicon Wafer with a Very Low Irradiation Dose For the purpose of avoiding dewetting during the cross-link of a single layer of X-PS having a thickness of 7.5-8.0 nm, the following steps are performed: cross-linkable polystyrene AZEMBLY™ NLD-128 is spin-coated at 1500 RPM onto a silicon wafer. The polymer film is soft-baked at 100° C. for one minute to remove the solvent, and then blanket-irradiated with $\lambda$=173 nm UV light in an $N_2$ purged chamber. An attenuating screen is used between the light source and the sample to deliver a dose of 2 mJ/cm$^2$. Alternatively, this dose could be provided without the use of an attenuating screen by replacing the light source with a less powerful one. This can lead to a partial crosslinking. Afterwards, the film is hard baked at 315° C. for 5 min in an $N_2$ atmosphere and rendered fully insoluble.

Example 4

Forming a Single Layer of Cross-Linked Polystyrene on a Silicon Wafer without Inert Atmosphere For the purpose of avoiding dewetting during the cross-link of a single layer of X-PS having a thickness of 7.5-8.0 nm, the following steps are performed: cross-linkable polystyrene AZEMBLY™ NLD-128 is spin-coated at 1500 RPM onto a silicon wafer. The polymer film is soft-baked at 100° C. for one minute to remove the solvent, and then blanket-irradiated with $\lambda$=173 nm UV light in a chamber under air at 1 atm. The dose is 1 mJ/cm$^2$. This leads to a partial crosslinking. Afterwards, the film is hard baked at 315° C. for 5 min under air at 1 atm and rendered fully insoluble.

Examples 5 and 6

Forming a Single Layer of Cross-Linked Polystyrene on a Silicon Wafer With Increased Exposure Doses Example 1 was repeated with exposure doses of 180 mj/cm$^2$ and 400 mj/cm$^2$. No dewetting was observed. At 180 mj/cm$^2$, the gel fraction was 83%. At 400 mj/cm$^2$, the gel fraction was 96% and the surface energy of X-PS was higher than for X-PS cross-linked according to example 1.

Figure 2:
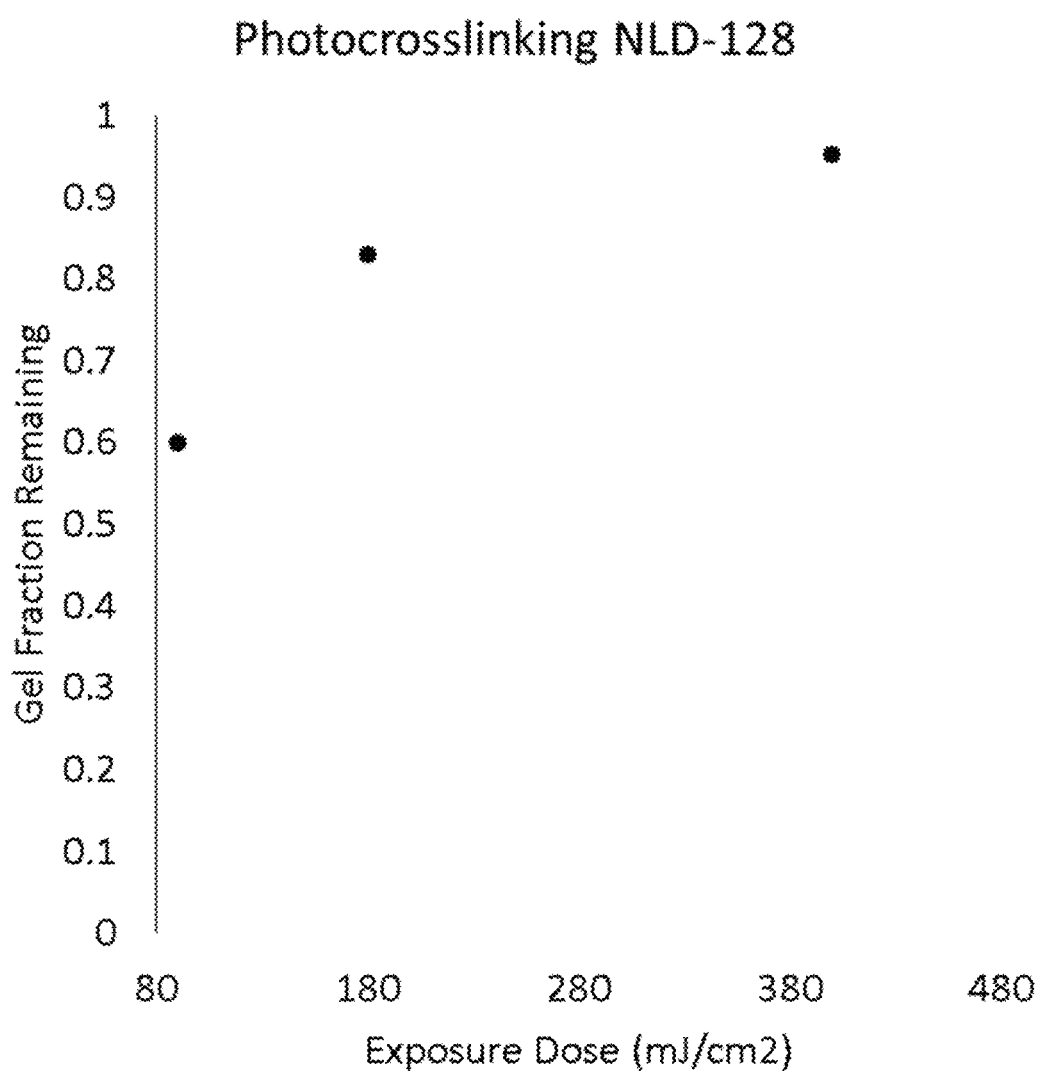
FIG. 2 is a graph of the gel fraction remaining on a substrate after rinsing as a function of the exposure dose.
Figure 3:
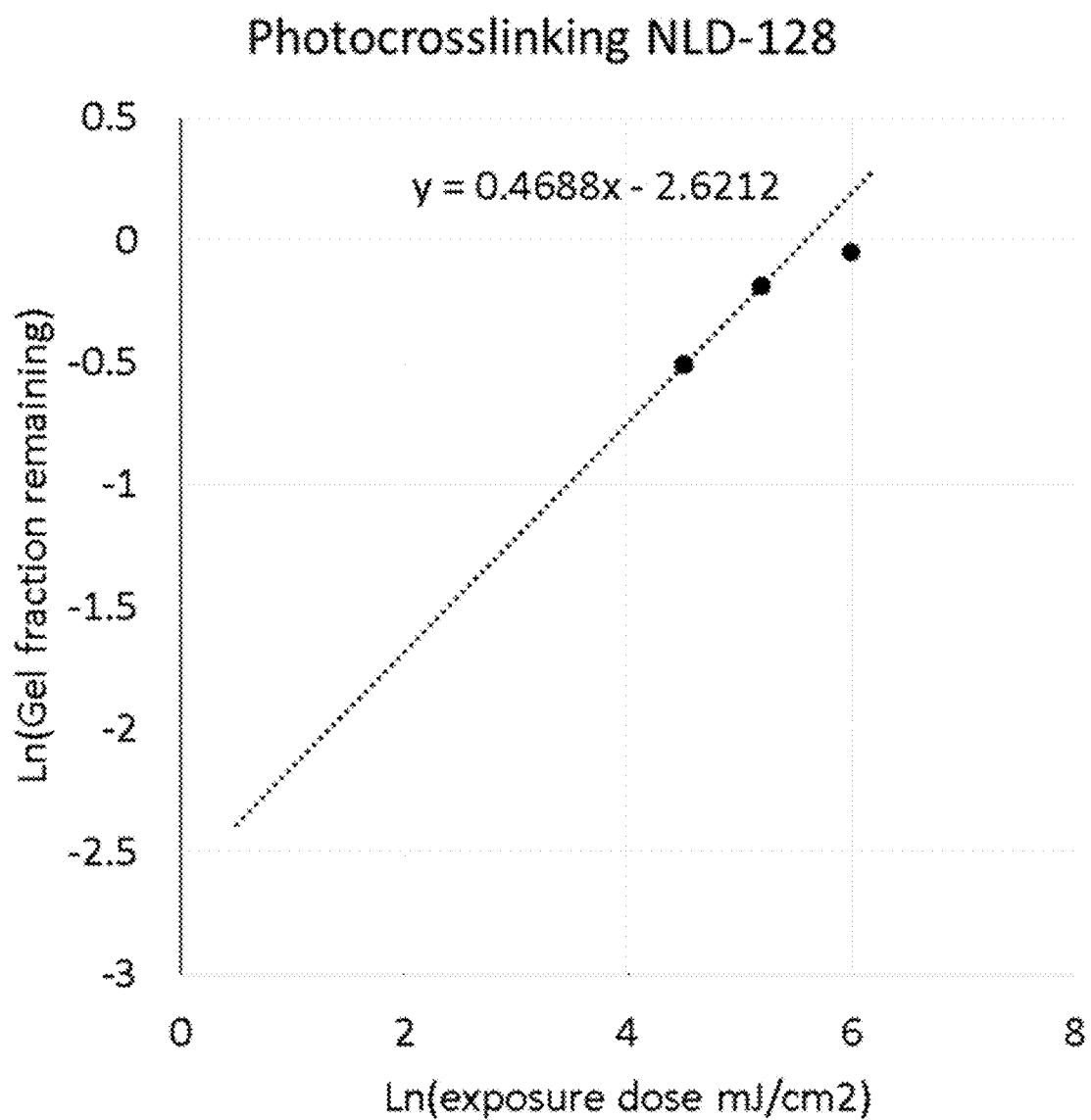
FIG. 3 is a graph of the natural logarithm (Ln) of the gel fraction remaining on a substrate after rinsing as a function of Ln of the exposure dose. An extrapolation to low doses based on the two smallest doses is depicted as a dotted line.

FIG. 2 summarize the gel fractions remaining observed at different exposure doses in examples 1, 5, and 6. FIG. 3 extrapolates the gel fraction remaining in function of the dose. From this extrapolation, it can be seen that a dose of 2 mJ/cm$^2$ is estimated to lead to a gel fraction remaining of 10%. The gel fraction of polymer films can typically increase with dose according to exponentially decaying kinetics as it progresses from the incipient gel towards the pseudo-equilibrium gel fraction obtained at exceedingly high doses. Therefore extrapolating backwards on a log-log plot can be a valid method for estimating gel fractions that would be present at lower doses.

Example 7

Forming a Single Layer of Cross-Linked Polystyrene on a SOG Layer

Referring to FIG. 1 (bottom), for the purpose of avoiding dewetting during the crosslink of a single layer of X-PS (3) having a thickness of 7.5-8.0 nm, the following steps were performed: cross-linkable polystyrene AZEMBLY™ NLD-128 (3) was spin-coated at 1500 RPM onto a Si/SOC (75 nm)/SOG (10 nm) (4) substrate (1). The polymer film (3) was soft-baked at 100° C. for one minute to remove the solvent, and then blanket-irradiated with λ=173 nm UV light in an N$_2$ purged chamber. The dose was 90 mJ/cm$^2$, which took <5 s to apply and was near the minimum possible dose that can be programmed into the tool. This led to a partial crosslinking. The gel fraction remaining, after that exposure, was 60%. Afterwards, the film was hard baked at 315° C. for 5 min in an N$_2$ atmosphere and rendered fully insoluble. No dewetting occurred.

Example 8

Forming a Second Layer of Cross-Linked Polystyrene on a SOG Layer

Starting from the fully insoluble film obtained at the end of Example 7, a second layer of cross-linkable polystyrene AZEMBLY™ NLD-128 was spin-coated thereon at 1500 RPM. The second polymer film (3) was soft-baked at 100° C. for one minute to remove solvent. Then, the film was baked at 315° C. for 5 more minutes under N$_2$. These conditions lead to autophobic dewetting of the second X-PS layer from the fully insoluble film obtained at the end of Example 7. However, the second X-PS layer did not dewet when the dose used in Example 7 was increased to photochemically modify the first layer of XPS, as described in Example 6. This example was repeated with different doses for the irradiation of the first layer. With 180 mJ, some dewetting still occurred, and with 400 mJ, no dewetting ever occurred. This also means the 400 mJ can change the surface energy of X-PS. In some embodiments, the dosage level may be below 400 mJ when a single X-PS crosslinked layer is formed. This procedure can generate an X-PS film thickness double than is obtained from a single layer of X-PS.

Example 9

Forming a Single Layer of a Random Copolymer of Cross-Linked 2-Vinyl Pyridine and 4-Vinyl Benzocylobutene (XP2VP) on a SOG Layer Referring to FIG. 1 and for the purpose of avoiding dewetting during the crosslink of a single layer of XP2VP having a thickness of 13 nm, the following steps are performed: the random copolymer (3) is spin-coated at 1500 RPM onto a Si/SOC (65 nm)/SOG (10 nm) (4) substrate (1). The polymer film (3) is soft-baked at 100° C. for one minute to remove the solvent, and then blanket-irradiated with λ=173 nm UV light in an N$_2$ purged chamber. The dose is 90 mJ/cm$^2$, which takes <5 s to apply and is near the minimum possible dose that can be programmed into the tool. This led to a partial crosslinking. Afterwards, the film was hard baked at 315° C. for 5 min in an N$_2$ atmosphere. No dewetting, even partial, is observed.

Example 10 (Comparative)

Figure 4:
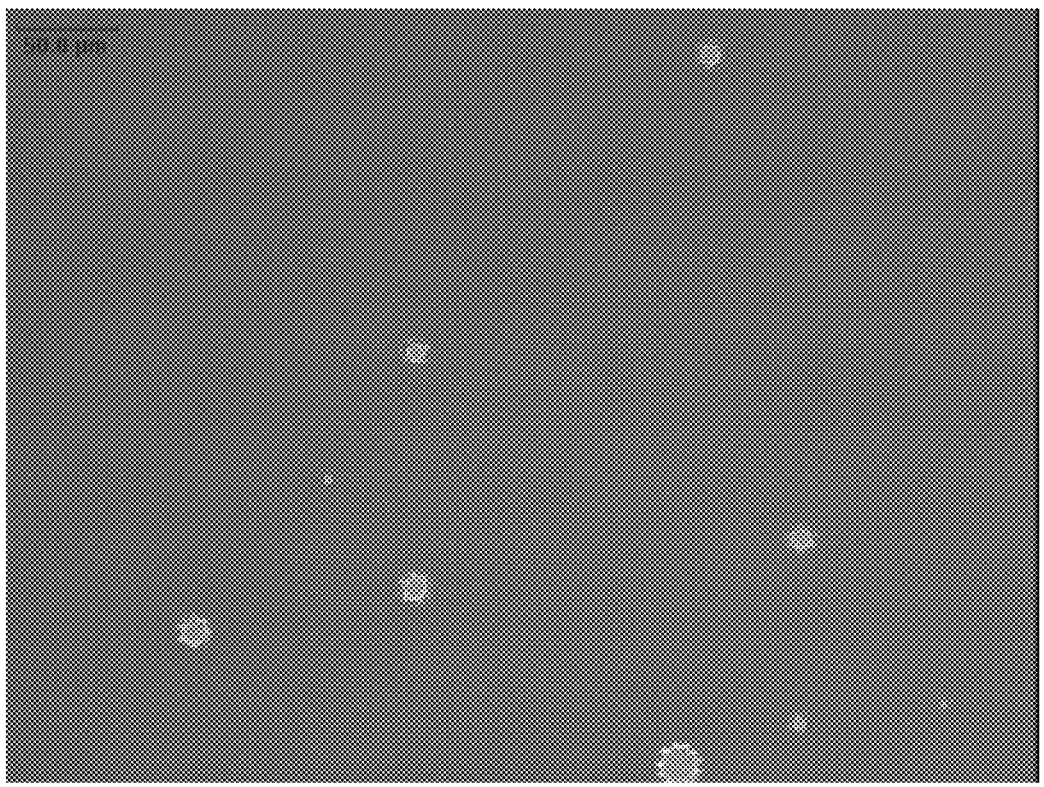
FIG. 4 is an optical micrograph at 10× magnification of an XP2VP sample cross-linked according to a convention procedure and showing pinholes.

Forming a Single Layer of a Random Copolymer of Thermally Cross-Linked 2-Vinyl Pyridine and 4-Vinyl Benzocylobutene (XP2VP) on a SOG Layer The following steps were performed: the random copolymer (3) was spin-coated at 1500 RPM onto a Si/SOC (65 nm)/SOG (10 nm) (4) substrate (1). The polymer film (3) was soft-baked at 100° C. for one minute to remove the solvent, and then the film was hard baked at 315° C. for 5 min in an N$_2$ atmosphere. Pinholes appeared in the film due to partial dewetting (see FIG. 4). Despite having a much higher surface energy than the X-PS AZEMBLY™ NLD-128, thermally crosslinked XP2VP, although not completely dewetting, dewets partially to show unacceptable pinholes (more than 2000 per cm$^2$).

Example 11 (Comparative)

Forming a Single Layer of Cross-Linked Polystyrene on a SOG Layer by Thermal Cross-Linking Referring to FIG. 1 (top), the following steps were performed: cross-linkable polystyrene AZEMBLY™ NLD-128 (3) (7.5-8 nm) was spin-coated at 1500 RPM onto a Si/SOC (75 nm)/SOG (10 nm) (4) substrate (1). The polymer film (3) was soft-baked at 100° C. for one minute to remove the solvent, and then the film was hard baked at 315° C. for 5 min in an N$_2$ atmosphere and rendered fully insoluble. Dewetting occurred.

Example 12

Forming a Second Layer of Cross-Linked Polystyrene on a First Photocrosslinked Polystyrene Layer To obtain a 7.5-8.0 nm thick coating of XPS by a "double layer" strategy, cross-linkable polystyrene AZEMBLY™

NLD-128 was spin-coated at 1500 RPM onto a silicon wafer, soft-baked at 100° C. for 1 min, and blanket irradiated by 90 mJ UV light. After rinsing the wafer with propylene glycol monomethyl ether acetate (PGMEA) for 45 s while the wafer rotated at 1500 RPM in a spin-coating module, a 5.7 nm thick residual layer of photo-crosslinked XPS remained. A second layer of cross-linkable polystyrene AZEMBLY™ NLD-128 was spin-coated at 1500 RPM, and baked on a 250° C. hotplate for 43 s. The wafer was rinsed again by PGMEA and hard-baked at 315° C. for 5 min in an $N_2$ atmosphere to achieve full cross-linking. To obtain the same final target thickness for new batches of cross-linkable polystyrene AZEMBLY™ NLD-128, the spin-coating rotational speed was adjusted.

It is to be understood that although representative embodiments, specific constructions and configurations, as well as materials, have been discussed herein for devices according to the present disclosure, various changes or modifications in form and detail may be made without departing from the scope of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A method for forming on a substrate a cross-linked layer for directing the self-assembly of a self-assembling material, the method comprising:
   a) providing a structure having the substrate;
   b) providing on the substrate a layer of a photo- and thermally cross-linkable substance which, when cross-linked, is suitable for directing the self-assembly of a self-assembling material;
   c) photocrosslinking the cross-linkable substance partially; and
   d) cross-linking the cross-linkable substance further thermally, thereby forming the cross-linked layer, wherein the method further comprises after step (d), a step (e) of providing on the cross-linked layer, a further layer of the photo- and thermally cross-linkable substance, and entirely cross-linking it thermally to form a cross-linked substance.

2. The method according to claim 1, wherein the substrate comprises a hardmask as a top layer.

3. The method according to claim 2, wherein the hardmask comprises a spin-on-glass top layer.

4. The method according to claim 1, wherein the photo- and thermally cross-linkable substance comprises a polymer comprising the following repeat unit

wherein Ar is an aromatic group, substituted or not.

5. The method according to claim 4, wherein the polymer comprises polymerized styrene repeat units, wherein the phenyl ring is substituted or not.

6. The method according to claim 4, wherein the polymer comprises a repeat unit imparting it with thermal cross-linkability.

7. The method according to claim 6, wherein the repeat unit is obtained from the copolymerization of a monomer selected from the list consisting of 4-vinyl benzocylobutene, glycidyl (meth)acrylate, and 4-vinyl benzyl azide.

8. The method according to claim 1, wherein the layer of a photo- and thermally cross-linkable substance as deposited in step (b) has a thickness lower than 100 nm.

9. The method according to claim 1, wherein step (c) of photocrosslinking the cross-linkable substance partially is performed with an energy ranging from 1 mJ/cm² to 1000 mJ/cm².

10. The method according to claim 1, wherein step (c) of photocrosslinking the cross-linkable substance partially is performed with an energy ranging from 2 mJ/cm² to 300 mJ/cm².

11. The method according to claim 1, wherein step (c) of photocrosslinking the cross-linkable substance partially is performed with an energy ranging from 10 mJ/cm² to 300 mJ/cm².

12. The method according to claim 1, wherein step (c) is performed under inert atmosphere.

13. The method according to claim 1, wherein step (c) has a duration of less than a minute.

14. The method according to claim 1, wherein step (d) leads to a complete crosslinking of the substance.

15. The method according to claim 1, further comprising a step (f) after step (e) of providing a self-assembling material on the cross-linked substance.

16. The method according to claim 1, after step (d), further comprising a step of providing a self-assembling material on the cross-linked layer.

17. The method according to claim 1, wherein the self-assembling material is a block copolymer comprising a polystyrene (PS) block and a poly(methyl methacrylate) (PMMA) block (PS-b-PMMA).

18. The method according to claim 1, wherein the thermal crosslinking step (d) is performed directly after step (c).

19. The method according to claim 1, further comprising, between step (b) and step (c), a step of heating the layer of cross-linkable substance at a temperature ranging from 80 to 120° C. for a time ranging from 30 s to 2 minutes.

* * * * *